United States Patent
Kasai

(10) Patent No.: US 8,446,068 B2
(45) Date of Patent: May 21, 2013

(54) ULTRASONIC MOTOR

(75) Inventor: Yasuaki Kasai, Saitama (JP)

(73) Assignee: Olympus Corporation, Tokyo (JP)

(*) Notice: Subject to any disclaimer, the term of this patent is extended or adjusted under 35 U.S.C. 154(b) by 261 days.

(21) Appl. No.: 12/973,454

(22) Filed: Dec. 20, 2010

(65) Prior Publication Data

US 2011/0163633 A1  Jul. 7, 2011

(30) Foreign Application Priority Data

Jan. 6, 2010 (JP) ................................ 2010-001493

(51) Int. Cl.
*H02N 2/00* (2006.01)
(52) U.S. Cl.
USPC ............ 310/323.16; 310/323.01; 310/323.13; 310/328
(58) Field of Classification Search
USPC ............ 310/323.01, 323.13, 323.16, 323.18, 310/328
See application file for complete search history.

(56) References Cited

U.S. PATENT DOCUMENTS

| 7,129,620 | B2 * | 10/2006 | Sakano et al. | 310/323.09 |
| 7,638,927 | B2 * | 12/2009 | Takasan et al. | 310/323.09 |
| 7,732,986 | B2 * | 6/2010 | Manabe | 310/328 |
| 7,851,972 | B2 * | 12/2010 | Takasan et al. | 310/323.04 |

FOREIGN PATENT DOCUMENTS

JP  2005-143176  6/2005

* cited by examiner

*Primary Examiner* — Thomas Dougherty
(74) *Attorney, Agent, or Firm* — Scully Scott Murphy & Presser, PC

(57) ABSTRACT

An ultrasonic motor for driving a driven object with a multi-degree of freedom includes a vibrator configured to simultaneously excite two vibration modes to generate an elliptic vibration on an output surface thereof, a driven object configured to be driven by the elliptic vibration generated on the output surface, and a driving element interposed between the output surface and the driven object. The driven object includes a spherical portion to be brought into contact with at least the output surface via the driving element. The elliptic vibration exhibits different vibration amplitudes at different positions on the output surface. The output surface includes a plurality of regions which exhibit greater vibration amplitudes than other regions on the output surface. The driving element includes a contact portion with at least two regions exhibiting greater vibration amplitudes than other regions of the contact portion, and is provided on the output surface.

6 Claims, 4 Drawing Sheets

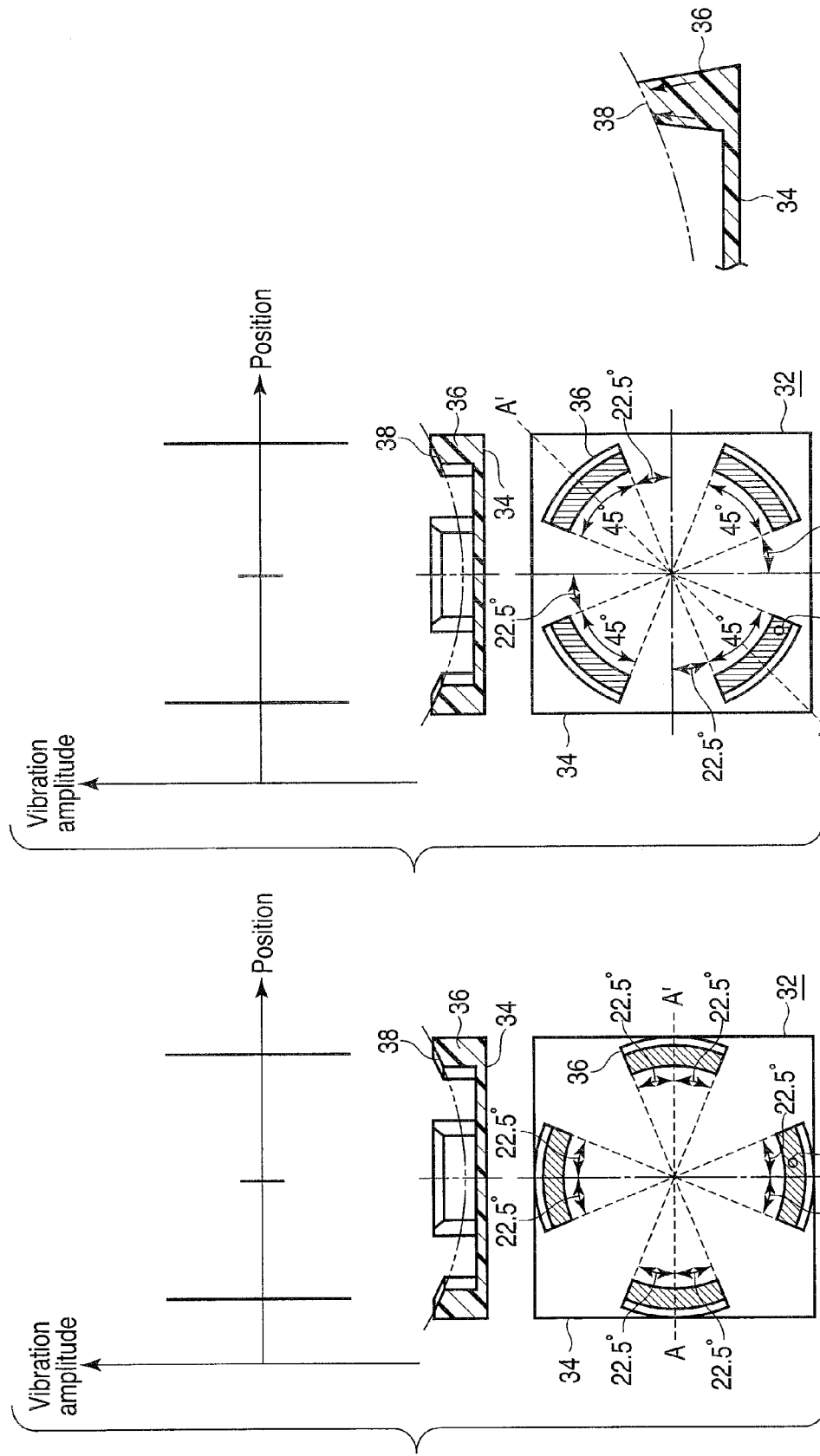

«ULTRASONIC MOTOR»

ULTRASONIC MOTOR

CROSS-REFERENCE TO RELATED APPLICATIONS

This application is based upon and claims the benefit of priority from prior Japanese Patent Application No. 2010-001493, filed Jan. 6, 2010, the entire contents of which are incorporated herein by reference.

BACKGROUND OF THE INVENTION

1. Field of the Invention

The present invention relates to an ultrasonic motor capable of driving a driven object with a multi-degree of freedom.

2. Description of the Related Art

An ultrasonic motor is known which applies a voltage to an ultrasonic vibrator to thereby friction drive a driven object kept in contact with the vibrator. In this case, if the driven object is made spherical to extract output therefrom, the ultrasonic motor can be used as a driving source of a multi-degree of freedom. Therefore, various applications of the ultrasonic motor, such as incorporation of the motor in a robot arm or a multi-joint arm, are expected.

As the ultrasonic motor capable of driving a driven object with a multi-degree of freedom, Jpn. Pat. Appln. KOKAI Publication No. 2005-143176, for example, has proposed a rotary driving device equipped with a driven object, rotary member support means, alternation power supply means, a vibrator, vibrator support means, rotation friction reduction means and pressing force adjusting means. The driven object has a substantially spherical surface. The rotary member support means supports the driven object so that the object can rotate about at least two axes. The alternation power supply means supplies electric energy to the vibrator. The vibrator converts, into mechanical energy, the electric energy supplied from the alternation power supply means, thereby generating a three-dimensional vibration. The vibrator support means supports the vibrator so that the vibrator will contact the substantially spherical surface of the driven object at a preset angle. The rotation friction reduction means reduces the friction that occurs when the driven object is rotated. The pressing force adjusting means adjusts, to a preset value, a pressing force with which the driven object and the vibrator contact each other.

In the rotary driving device disclosed in the above publication, the central portion of the upper surface (i.e., the output surface) of the vibrator is in point contact with the spherical surface of the driven object from the relationship between the output surface of the vibrator and the spherical surface of the object. Using the elliptic motion of the vibrator as a driving source, the driven object is friction driven about the contact point.

The vibrator will abrade at the contact point at which the vibrator and the spherical surface of the driven object directly contact each other. Further, the contact point will shift in accordance with the abrasion. Thus, the operation of the driving device is unstable.

To suppress the abrasion of the vibrator, the above publication has proposed to provide a sliding member on the upper portion of the vibrator. However, since the sliding member also abrades in accordance with the rotation of the vibrator, it does not fundamentally solve the abrasion problem.

BRIEF SUMMARY OF THE INVENTION

According to an aspect of embodiments, there is provided an ultrasonic motor for driving a driven object with a multi-degree of freedom, comprising:

a vibrator having an output surface and configured to simultaneously excite two vibration modes to generate an elliptic vibration on the output surface;

a driven object configured to be driven by the elliptic vibration generated on the output surface; and a driving element interposed between the output surface and the driven object, wherein the driven object includes a spherical portion to be brought into contact with at least the output surface via the driving element;

the elliptic vibration exhibits different vibration amplitudes at different positions on the output surface;

the output surface includes a plurality of regions which exhibit greater vibration amplitudes than other regions on the output surface; and the driving element includes a contact portion with at least two regions exhibiting greater vibration amplitudes than other regions of the contact portion, and is provided on the output surface.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a view illustrating the shape of the driving element of an ultrasonic motor according to a second embodiment of the present invention, and useful in explaining the relationship between the position on the driving element and the vibration amplitude;

FIG. 7 is a view illustrating the shape of the driving element of an ultrasonic motor according to a modification of the second embodiment, and useful in explaining the relationship between the position on the driving element and the vibration amplitude; and FIG. 8 is a view illustrating the shape of the driving element of an ultrasonic motor according to a third embodiment of the present invention.

DETAILED DESCRIPTION OF THE INVENTION

Figure 1:
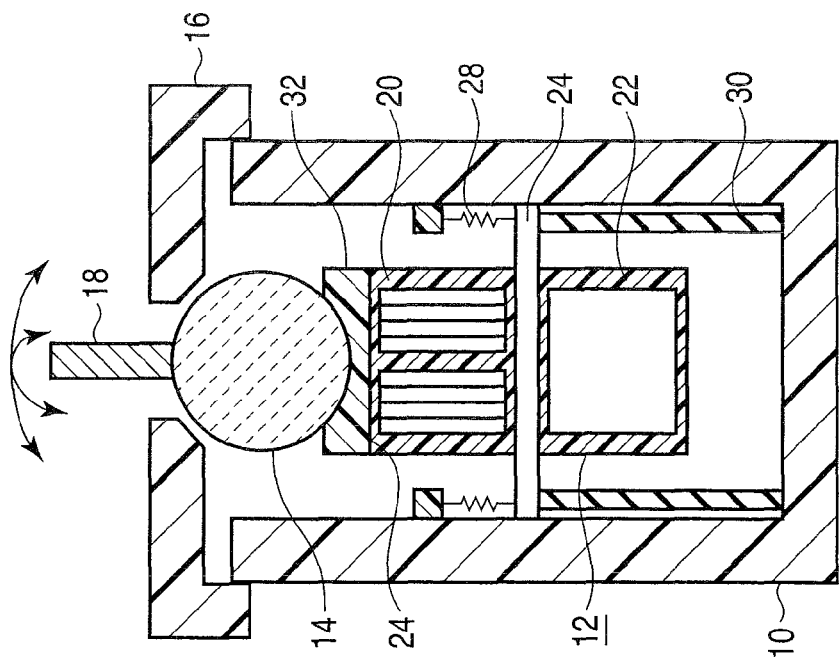
FIG. 1 is a sectional view illustrating the structure of an ultrasonic motor according to a first embodiment of the present invention.

As shown in FIG. 1, an ultrasonic motor according to a first embodiment of the invention includes a cylindrical case 10 having a rectangular cross section and one opening. A vibrator 12 and a driven object 14 are contained in the case 10. The opening of the case 10 is closed by a cap 16. The cap 16 has an opening. An output shaft 18 is fixed to the driven object 14. The output shaft 18 is extended through the opening of the cap 16.

The case 10 and cap 16 are formed of, for example, member made of a resin with a high strength such as a peek, or metal.

The vibrator 12 is formed by stacking rectangular piezoelectric elements made of, for example, zirconate titanate. Using the stacked state of the piezoelectric elements, an X-axial bend portion 20 that bends along the X-axis, and a Y-axial bend portion 22 that bends along the Y-axis are formed. By supplying a predetermined alternating signal to the vibrator 12, two different vibration modes, such as longitudinal and flexural vibrations are simultaneously excited. As a result of synthesis of these different vibration modes, an elliptic vibration will occur on the upper end surface or output surface 24 of the vibrator 12. For particulars of the structure of the vibrator 12 and the elliptic vibration occurring on the output surface 24 thereof, see the afore-mentioned publication Jpn. Pat. Appln. KOKAI Publication No. 2005-143176.

The vibrator 12 is attached to the case 10 via an vibrator holder 26 made of, for example, a resin or metal material so that it can expand and contract. Further, for adjusting the press force of the vibrator 12 toward the driven object 14 to an appropriate value, a press mechanism 28 formed of springs and a press force adjusting member 30 formed rubber members are provided between the vibrator holder 26 and the case 10.

The driven object 14 is made of a ceramic-based material such as zirconia or alumina, and formed spherical. The driven object 14 is friction-driven by the elliptic vibration that occurs on the output surface 24 of the vibrator 12. In this case, by adjusting the X- and Y-directional driving forces, a driving force in an arbitrary direction can be acquired. For particulars of the driving method, also see Jpn. Pat. Appln. KOKAI Publication No. 2005-143176. Although the driven object 14 can be driven with a multi-degree of freedom, the movement of the output shaft 18 fixed to the driven object 14 is limited by the size and shape of the opening of the cap 16.

Figure 2:
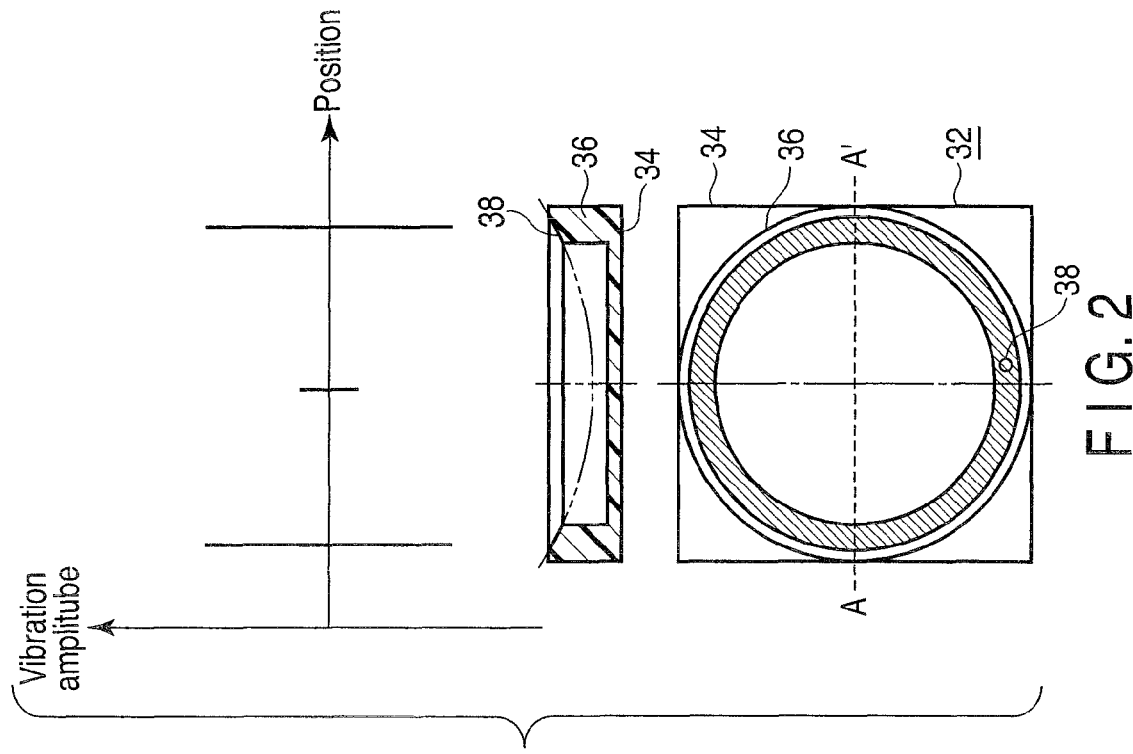
FIG. 2 is a view illustrating the shape of the driving element of the ultrasonic motor of the first embodiment, and useful in explaining the relationship between the position on the driving element and the vibration amplitude.

In the ultrasonic motor of the first embodiment, a driving element 32 is adhered to the output surface 24 between the vibrator 12 and the driven object 14. The driving element 32 is made of a resin material having a high abrasion resistance (such as a material obtained by containing potassium titanate whisker in polyphenylene sulfide (PPS), Teflon (trademark) resin, or fluorin resin). As shown in FIG. 2, the driving element 32 includes a base portion 34 and a contact portion 36. The base portion 34 has a rectangular shape corresponding to the size of the output surface 24. The contact portion 36 has a convex shape with a projection vertically projecting from the base portion 34 away from the vibrator 12, namely, toward the driven object 14.

One end surface of the contact portion 36 is processed to a shape of a bowl in accordance with the curvature of the spherical driven object 14. The processed surface serves as a contact surface 38 to be brought into contact with the driven object 14. In the lowest plan view of FIG. 2, the contact surface 38 is shown hatched. It should be noted that this hatching does not indicate a cross section. Further, the contact portion 36 is formed symmetrical with respect to the orthogonal axes (X and Y axes) on the output surface 24 of the vibrator 12. In the first embodiment, the contact portion 36 is formed annular so that it is symmetrical about an intersection point of the orthogonal axes.

Figure 3A:
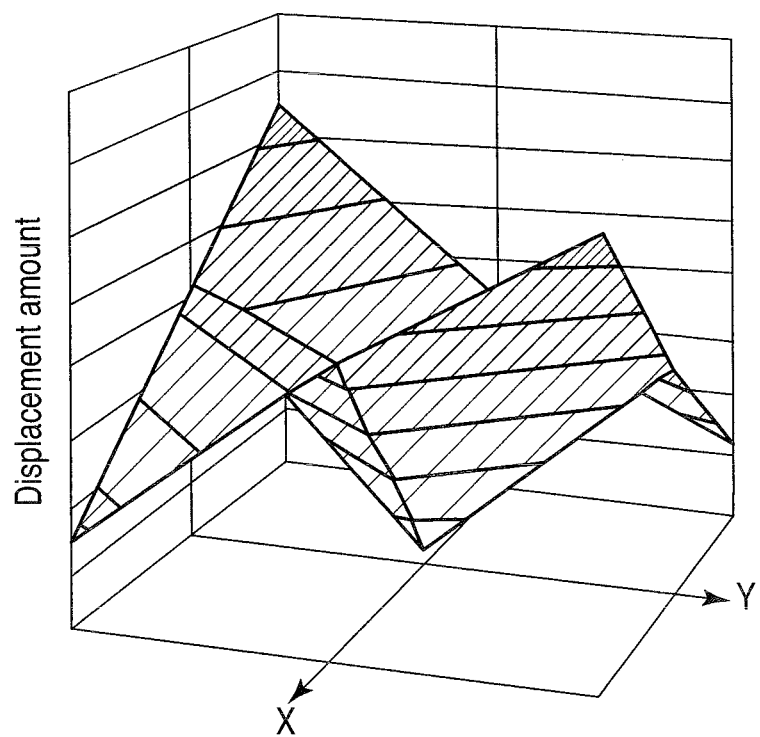
FIG. 3A is a view illustrating the vibration amplitude levels of the output surface of the vibrator incorporated in the ultrasonic motor of the first embodiment.
Figure 3B:
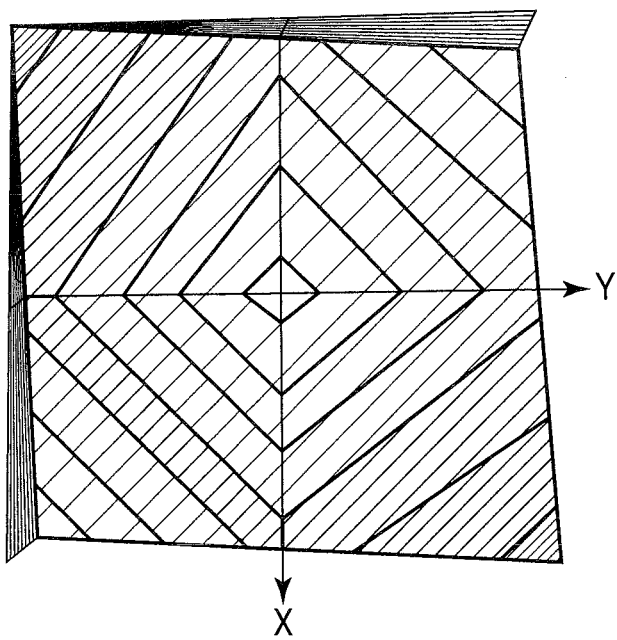
FIG. 3B is a plan view illustrating the vibration amplitude levels of FIG. 3A.

The output surface 24 of the vibrator 12 performs an elliptic vibration as described above. FIGS. 3A and 3B show the measured vibration amplitudes of the respective portions of the output surface 24. In FIGS. 3A and 3B, the thicker the hatching, the greater the vibration amplitude.

As is evident from FIGS. 3A and 3B, the vibration amplitude of the output surface 24 varies at different positions on the output surface 24, and there exist a plurality of regions which exhibit greater vibration amplitudes than the peripheral regions. Namely, the center of the output surface 24 has a smallest vibration amplitude, and portions of the output surface 24 diagonally away from the center exhibit greater amplitudes. Further, in positions away from the center by a predetermined distance or more, the vibration amplitude continues to increase in certain opposite diagonal directions, while decreasing in the diagonal directions perpendicular to the certain diagonal directions.

The directions, in which the vibration amplitude varies, are not limited to the diagonal directions, but can be set arbitrarily (e.g., can be changed to the axial directions) by changing the vibration mode and resonance frequency.

The annular contact portion 36 has its diameter and position determined to include at least two regions which exhibit great vibration amplitudes. In the elliptic vibration shown in FIGS. 3A and 3B, the first embodiment includes two regions which are located in certain opposite diagonal directions and exhibit great vibration amplitudes, and two regions which are located in the other opposite diagonal directions and exhibit vibration amplitudes slightly smaller than the above but much greater than the central region. In view of this, the contact surface 38 to be brought into contact with the driven object 14 is provided at positions having great vibration amplitudes in the cross section A-A' of the driving element 32, as is shown in FIG. 2.

In the ultrasonic motor constructed as the above, the driving element 32 incorporates the contact portion 36 that contacts the driven object 14 at several positions, and the contact surface 38 of the contact portion 36 is shaped like a bowl in accordance with the curvature of the driven object 14 so that it is kept in surface contact with the driven object 14. By virtue of this structure, the driven object 14 can be reliably held, which stabilizes the contact surface of the driven object 14. As a result, reliable multi-degree-freedom driving of the driven object 14 is realized. Further, the contact portion 36 is provided symmetrical with respect to the orthogonal axes on the output surface 24 of the vibrator 12. For instance, the contact portion 36 is an annular member that is symmetrical about a point, which enables the driven object 14 to be held stably. Thus, in the ultrasonic motor of the first embodiment, the driving element 32, which contacts the driven object 14 in at least two positions in which greater vibration amplitudes are observed, is provided between the driven object 14 and the vibrator 12. As a result, the driven object 14 can be held in a reliable contact, which realizes reliable multi-degree-freedom driving of the driven object 14.

Furthermore, since the driving element 32 is made of a material having a high abrasion resistance, the contact between itself and the driven object 14 is kept in a further reliable state, thereby further stabilizing the driving.

In addition, since the driving element 32 is formed by integrating the contact portion 36 with the base portion 34 having a rectangular bottom, it can be easily attached to the vibrator 12.

Also, the contact portion 36 of the driving element 32 is positioned selectively to cover the regions which exhibit greater vibration amplitudes. Thus, the driven object 14 is not in contact with the regions which exhibit smaller vibration amplitudes, which enables the driven object 14 to be driven at the portions that vibrate greatly. As a result, the driving amount of the driven object 14 can be increased.

Figure 4:
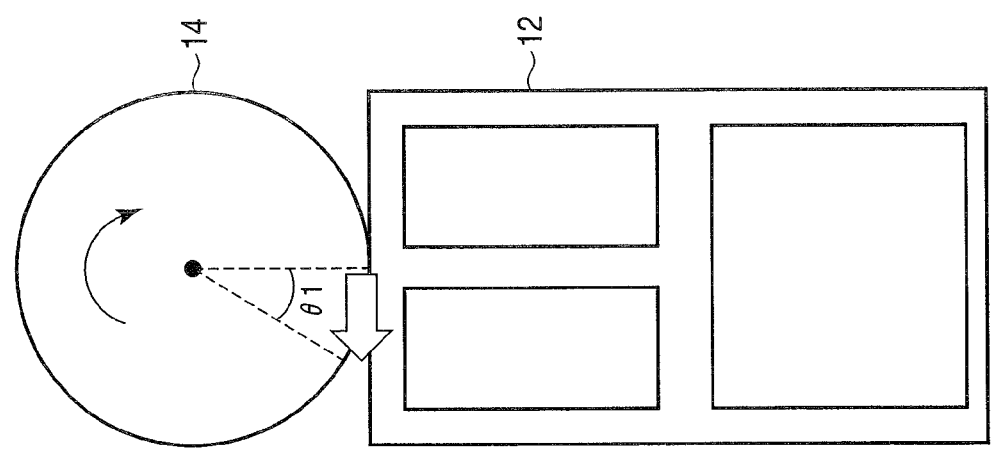
FIG. 4 is a view useful in explaining the driving amount of a conventional ultrasonic motor.

In the prior art shown in FIG. 4, the driven object 14 is friction driven at the center that has the smallest vibration amplitude as indicated by the thick arrow. At this time, the angle, through which the driven object 14 is rotated in one vibration cycle of the vibrator 12, is θ1. The length of the thick white-arrow represents the level of the vibration amplitude measured as shown in FIGS. 3A and 3B.

Figure 5:
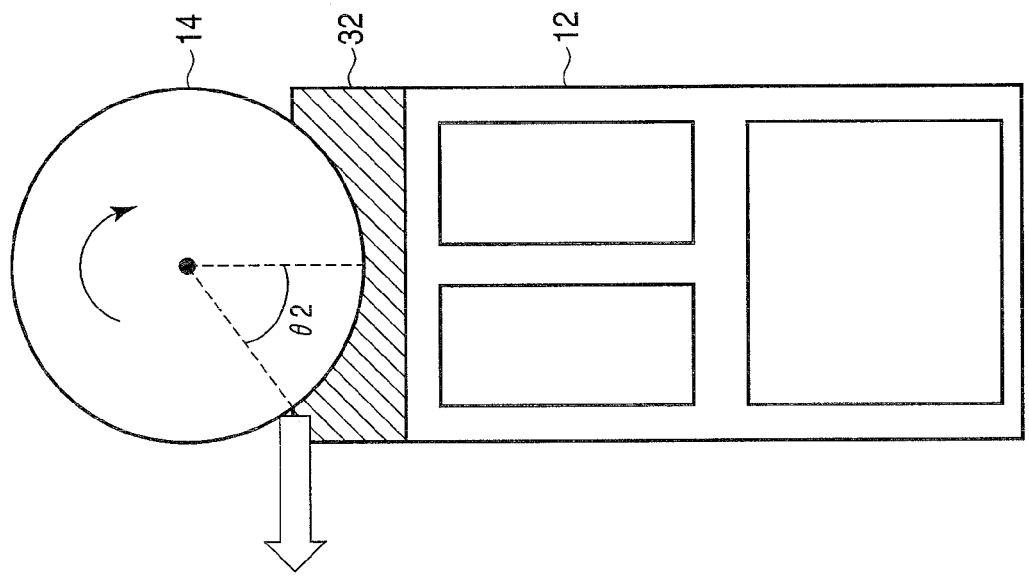
FIG. 5 is a view useful in explaining the driving amount of the ultrasonic motor of the first embodiment.

In contrast, in the ultrasonic motor of the first embodiment shown in FIG. 5, when the vibration mode and resonance frequency of the vibrator 12 are set to the same values as in the prior art and the weight and surface roughness of the driven object 14 are also set to the same values as in the prior art, the portions of the driven object 14, which have greater vibration amplitudes than the vibration amplitude in the prior art, are friction driven as indicated by the thick white-arrow. At this time, the angle, through which the driven object 14 is rotated in one vibration cycle of the vibrator 12, is θ2 greater than θ1. Thus, the ultrasonic motor of the first embodiment can more greatly rotate the driven object 14 than in the prior art.

A second embodiment according to the present invention will now be described. In the second embodiment, elements similar to those of the first embodiment are denoted by corresponding reference numbers, and no detailed description will be given thereof. A description will be given only to different elements.

In the first embodiment, the contact portion 36 of the driving element 32 is formed annular. In contrast, in an ultrasonic motor according to the second embodiment, the contact portion 36 is formed axisymmetrical by eliminating parts of the annular contact portion 36, as is shown in FIGS. 6 and 7. In the lowest plan views of FIGS. 6 and 7, the contact surface 38 is shown hatched. It should be noted that this hatching does not indicate a cross section. As shown, in the ultrasonic motor of the second embodiment, the contact portion 36 includes four regions that exhibit greater vibration amplitudes than the other regions. The positions of the four regions can be determined in accordance with the desired sliding direction of the output shaft 18.

By virtue of this structure, the second embodiment can provide the same advantage as the first embodiment. Further, in the second embodiment, since the contact portion 36 is formed axisymmetric, it can reliably hold the driven object 14, although the degree of holding reliability is slightly lower than in the first embodiment.

Also, in the first embodiment, the contact portion 36 is annular, and hence the driving force acquired from regions of great vibration amplitudes cannot directly be utilized, but only a driving force resulting from the average vibration amplitude of all regions can be utilized. In contrast, in the second embodiment, only regions of great vibration amplitudes can be selected, namely, a great driving force acquired from the great vibration amplitude regions can be directly utilized. Thus, in the second embodiment, a greater driving force than in the first embodiment can be utilized.

It is a matter of course that the number of regions included in the contact portion 36 is not limited to four, but two or more regions, which are arranged symmetrical, may be included.

A third embodiment will be described. In the third embodiment, elements similar to those of the first or second embodiment are denoted by corresponding reference numbers, and no detailed description will be given thereof. A description will be given only to different elements.

In the ultrasonic motor according to the first or second embodiment, the contact portion 36 of the driving element 32 is formed as a projection vertically projecting from the base portion 34 away from the vibrator 12, i.e., to the driven object 14. In the ultrasonic motor of the third embodiment, the contact portion 36 is upwardly tapered toward the driven object 14 as shown in FIG. 8.

This structure can provide the same advantage as in the first and second embodiments.

Furthermore, the contact portion 36 of the third embodiment can concentrate, like an ultrasonic horn, vibration energy on the driven object 14 as indicated by the arrows in FIG. 8, thereby minimizing vibration energy loss. As a result, a greater driving force can be acquired.

Although in the first through third embodiments, the entire driven object 14 is spherical, the shape of the object 14 is not limited to this. It is sufficient if the portion of the driven object 14 that is brought into contact with the contact portion 36 of the driving element 32 has a spherical surface.

In addition, the X-axial bend portion 20 and Y-axial bend portion 22 of the vibrator 12 may be arranged upside down.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An ultrasonic motor for driving a driven object with a multi-degree of freedom, comprising:
   a vibrator having an output surface and configured to simultaneously excite two vibration modes to generate an elliptic vibration on the output surface;
   a driven object configured to be driven by the elliptic vibration generated on the output surface; and
   a driving element interposed between the output surface and the driven object, wherein
   the driven object includes a spherical portion to be brought into contact with at least the output surface via the driving element;
   the elliptic vibration exhibits different vibration amplitudes at different positions on the output surface;
   the output surface includes a plurality of regions which exhibit greater vibration amplitudes than other regions on the output surface; and
   the driving element includes a contact portion with at least two regions exhibiting greater vibration amplitudes than other regions of the contact portion, and is provided on the output surface;
   wherein the contact portion is formed symmetrical with respect to intersecting axes on the output surface and the contact portion is formed axisymmetrical with respect to the orthogonal axes on the output surface.

2. An ultrasonic motor
   for driving a driven object with a multi-degree of freedom, comprising:
   a vibrator having an output surface and configured to simultaneously excite two vibration modes to generate an elliptic vibration on the output surface;
   a driven object configured to be driven by the elliptic vibration generated on the output surface; and
   a driving element interposed between the output surface and the driven object, wherein
   the driven object includes a spherical portion to be brought into contact with at least the output surface via the driving element;
   the elliptic vibration exhibits different vibration amplitudes at different positions on the output surface;

the output surface includes a plurality of regions which exhibit greater vibration amplitudes than other regions on the output surface; and the driving element includes a contact portion with at least two regions exhibiting greater vibration amplitudes than other regions of the contact portion, and is provided on the output surface;

wherein the contact portion is formed symmetrical with respect to intersecting axes on the output surface, the contact portion has a projection extending from the output surface to the driven object; and part of the projection functions as a contact surface that contacts the driven object.

3. The ultrasonic motor according to claim 2, wherein the contact portion is in a shape of a bowl corresponding to a curvature of the driving element.

4. The ultrasonic motor according to claim 3, wherein the projection is tapered toward the driven object.

5. The ultrasonic motor according to claim 4, wherein the driving element is made of a resin.

6. The ultrasonic motor according to claim 5, wherein the two vibration modes include a longitudinal vibration and a flexural vibration; and the longitudinal vibration and the flexural vibration are combined to generate the elliptic vibration.

\* \* \* \* \*